United States Patent
Yamahira

(10) Patent No.: US 6,311,091 B1
(45) Date of Patent: Oct. 30, 2001

(54) SUBSTITUTE PROCESSING APPARATUS WITH POWER DISTRIBUTION CONTROL FOR REDUCED POWER CONSUMPTION DURING APPARATUS START UP

(75) Inventor: Yutaka Yamahira, Kumamoto (JP)

(73) Assignee: Tokyo Electric Limited, Tokyo (JP)

( * ) Notice: Subject to any disclaimer, the term of this patent is extended or adjusted under 35 U.S.C. 154(b) by 0 days.

(21) Appl. No.: 09/174,541

(22) Filed: Oct. 19, 1998

(30) Foreign Application Priority Data

Oct. 24, 1997  (JP) .................................................... 9-292604

(51) Int. Cl.⁷ .............................. G05B 11/32; H05B 1/02
(52) U.S. Cl. ......................... 700/11; 700/121; 700/297; 700/299; 700/300; 219/486
(58) Field of Search ..................................... 700/121, 299, 700/300, 297, 296, 295, 11; 219/412, 480, 482, 486

(56) References Cited

U.S. PATENT DOCUMENTS

| | | | | |
|---|---|---|---|---|
| 3,586,869 | * | 6/1971 | Kompelien | 307/41 |
| 4,477,733 | * | 10/1984 | Herdeman | 307/35 |
| 4,520,274 | * | 5/1985 | Stants | 307/39 |
| 4,881,591 | * | 11/1989 | Rignall | 165/206 |
| 5,127,362 | * | 7/1992 | Iwatsu et al. | 219/483 |
| 5,563,455 | | 10/1996 | Cheng | 307/41 |
| 5,661,093 | * | 8/1997 | Ravi et al. | 438/763 |
| 5,678,116 | * | 10/1997 | Sugimoto et al. | 396/611 |
| 5,980,591 | * | 11/1999 | Akimoto et al. | 29/25.01 |
| 6,060,697 | * | 5/2000 | Morita et al. | 219/483 |

FOREIGN PATENT DOCUMENTS

| | | |
|---|---|---|
| 5-216543 | 8/1993 | (JP) . |
| 5-250045 | 9/1993 | (JP) . |
| 6-104248 | 4/1994 | (JP) . |

* cited by examiner

Primary Examiner—William Grant
Assistant Examiner—Paul Rodriguez
(74) Attorney, Agent, or Firm—Rader, Fishman & Grauer, PLLC

(57) ABSTRACT

A substrate processing apparatus for coating resist onto a substrate and developing the coated resist, comprising a power supply equipped with a main switch controlled in an ON/OFF manner, a plurality of electric appliances operated substantially in the same manner when power is supplied from the power supply, a power distribution circuit for supplying power to each of the plurality of electric appliances, and a control section connected to the power distribution circuit, for controlling power-supply timing to the plurality of electric appliances. The control section staggers power-supply timing to each of the electric appliances when the main switch is turned on.

9 Claims, 7 Drawing Sheets

SUBSTITUTE PROCESSING APPARATUS WITH POWER DISTRIBUTION CONTROL FOR REDUCED POWER CONSUMPTION DURING APPARATUS START UP

BACKGROUND OF THE INVENTION

The present invention relates to a substrate processing apparatus for coating resist onto a substrate such as a semiconductor wafer and an LCD substrate (liquid crystal display) and developing the resist-coated film pattern-exposed.

In a photolithographic process for manufacturing a semiconductor device and an LCD, a substrate is coated with resist, exposed to light and developed. The series of processes as mentioned is usually carried out by using a substrate processing apparatus. The substrate processing apparatus has a plurality of heating units including a preliminary heating unit and a dry unit. Each of the heating units has a hot plate installed therein.

The hot plate has a built-in electrical resistance heater, which generates heat when current is supplied thereto. To warm up a hot plate, which is cold at the time the apparatus is started up, to a required temperature, it takes about several to ten minutes after power supply is started. However, to stabilize the temperature of the hot plate, approximately 30 minutes is required after the initiation of the power supply. During the start-up period in which a cold hot-plate is warmed up to a predetermined temperature, a large power consumption is required, whereas in the stable condition after the hot plate reaches the predetermined temperature, power is supplied intermittently. Hence, required power consumption is a reactively low.

In the processing apparatus, i.e., a coating/developing apparatus, a wafer W is loaded into processing units in a predetermined order. The wafers are loaded into each of the processing units one by one in accordance with the predetermined order. Therefore, it may be sufficient if each processing unit is warmed up to the stable state by the time the wafer W is loaded therein.

However, in a conventional coating and developing apparatus, power is supplied to each of the built-in heaters of a plurality of processing units simultaneously at the time the apparatus is started up. Hence, a large amount of power is consumed at the start-up time. In this connection, electric parts having a large capacity (tolerance) must be used in a power supply cable and a breaker, etc. As a result, the manufacturing cost of the apparatus inevitably increases. Since the power supply cable and the breaker must have a capacity nearly 4 times larger than the power-consumption at a normal operation time, the breaker may not properly work if a large power is consumed when abnormality accidentally takes place during the normal operation time, failing in security control.

BRIEF SUMMARY OF THE INVENTION

An object of the present invention is to provide a substrate processing apparatus without consuming a large amount of power at the time the apparatus is started up.

According to the present invention, there is provided a substrate processing apparatus for coating resist onto a substrate and developing the coated resist, comprising:

a power supply equipped with a main switch which is turned-on and turned-off;

a plurality of electric appliances operated substantially in the same manner when power is supplied from the power supply;

a power distribution circuit for supplying power to each of the plurality of electric appliances; and a control section connected to the power distribution circuit, for controlling power-supply timing to the plurality of electric appliances;

in which the control section stagger power-supply timing to each of the electric appliances when the main switch is turned on.

Each of the electric appliances has a heater for heating the substrate or a cooler for cooling the substrate. In addition, each of the electric appliances has an air conditioner for supplying clean air around the substrate to be processed. Furthermore, each of the electric appliances has a temperature controlling mechanism for controlling temperature of a processing solution for processing the substrate.

It is preferable that the control section should determine power supply order to each of the electric appliances on the basis of the usage order of the plurality of electric appliances.

It is further preferable that the apparatus of the present invention should comprise a plurality of processing units each having one of the electric appliances; in which at least two of the plurality of processing units have a heating mechanism. In this case, it is further preferable that the control section should supply power to each of the heating mechanism in accordance with the usage order of the heating mechanisms.

According to the present invention, there is provided a substrate processing apparatus for coating resist onto a substrate and developing a coated resist, comprising:

a power supply equipped with a main switch which is turned-on and turned-off;

a plurality of thermal processing mechanisms for heating or cooling the substrate when power is supplied from the power supply;

a power distribution circuit equipped with a plurality of switches for turning-on/off power supply to each of the plurality of thermal processing mechanisms;

a temperature detector or detecting temperature of each of the thermal processing mechanisms;

control means for controlling ON/OFF of the switch on the basis of detection temperature detected by the temperature detector; and inhibition means for inhibiting each of the switches of the power distribution circuit not to be turned-on when power supply is initiated to the heating mechanisms by turning on the main switch.

It is desirable that the inhibition means should release the ON-inhibition of each of the switches of the power distribution circuit at time intervals.

It is also desirable that the inhibition means should release the ON-inhibition of each of the switches of the power distribution circuit, at time intervals.

It is further desirable that the inhibition means should release the ON-inhibition to each of the switches of the power distribution circuits in accordance with the usage order of the heating mechanism.

According to the present invention, the starting-up times for a plurality of the heating means, at which power is continuously supplied thereto, do not converge on one time. It is therefore possible to prevent a large power consumption at the starting-up time of the apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
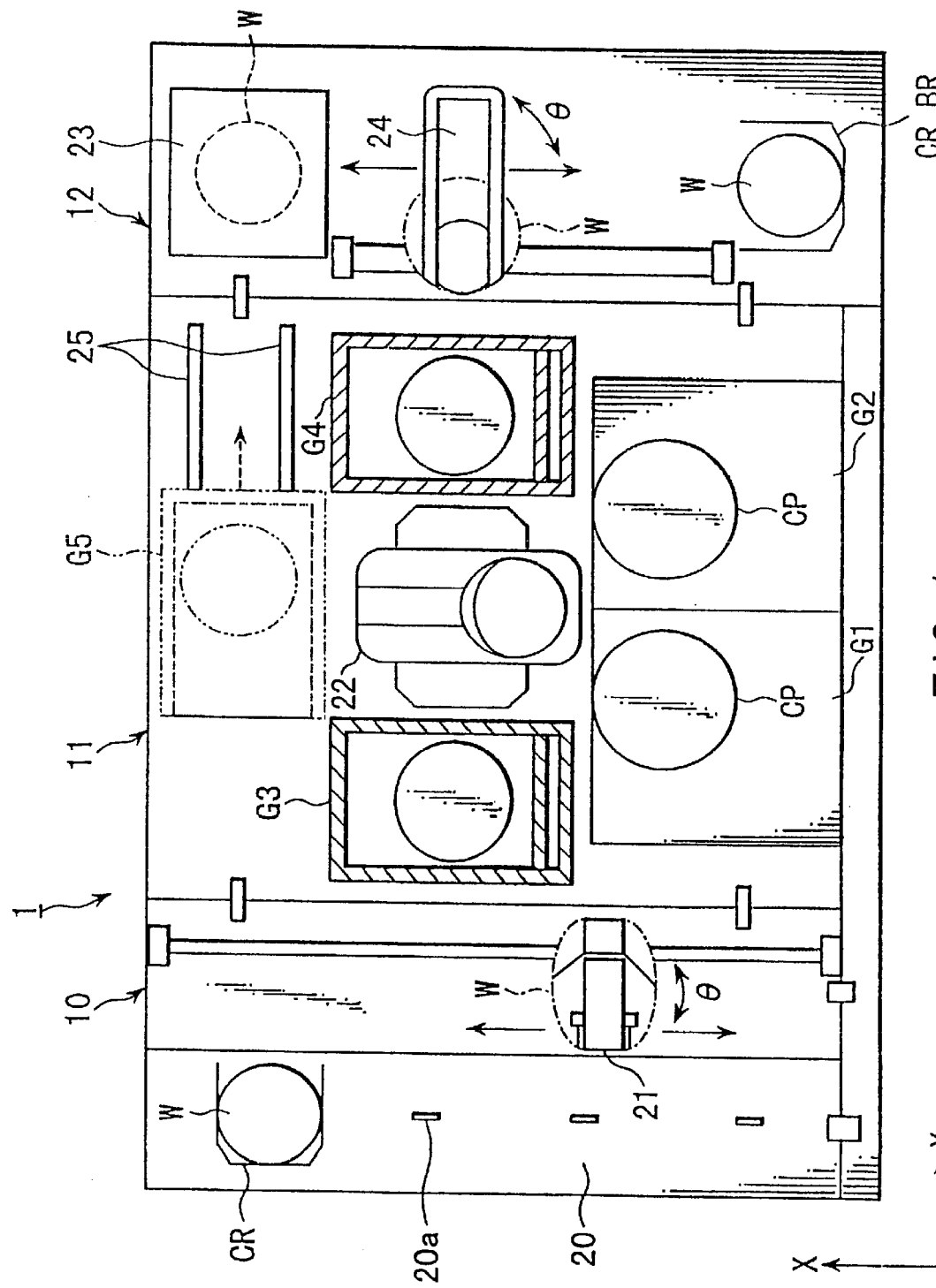
FIG. 1 is a perspective plan view of an entire structure of a substrate processing apparatus (coating/developing system) of the present invention.

Now, preferred embodiments of the present invention will be explained with reference to the accompanying drawings. In this embodiment, we will explain the coating/developing system in which resist is coated onto a semiconductor wafer W and then developed.

The substrate processing apparatus, i.e., a coating/developing system 1 has a cassette section 10, a processing section 11, and an interface section 12. The coating/developing system 1 is connected to a light exposure apparatus (not shown) via the interface section 12. A plurality of fan filter units FFU1-FFU6 (hereinafter referred to as "FFU") are provided at the upper portions of sections 10, 11, 12. Clean air is supplied to each of the sections 10, 11, 12 of the processing system 1 through the FFU1-6, thereby forming a clean-air descending flow within the section 10, 11, 12. Each of the cases of FFU1-6 contains a fan (not shown) and a filter (not shown). Air is introduced by the assistance of the fan and cleaned by the filter, which removes foreign matters such as particles and alkaline components from the introduced air. Power supply switches of motors for driving the rotation of the FFU1-6, are respectively controlled by control sections 111, 112 ... 11n of a power supply controlling circuit 200 (described later).

The cassette section 10 has a table 20 and a sub-arm mechanism 21. The table 20 extends in an X-direction. Four protrusions 20a are provided on the upper surface of the table 20. A cassette CR is mounted on each of the protrusions 20a, thereby being placed at a right position relative to the sub-arm mechanism 21. The sub arm mechanism 21 has a wafer holding portion, a back-and-forth moving mechanism for moving the wafer holding portion back and forth, an X-axis moving mechanism for moving the wafer holding portion in the X-axis direction, a Z-axis moving mechanism for moving the wafer holding portion in a Z-axis direction, and a θ moving mechanism for rotating the wafer holding portion about the Z-axis. Each of the cassettes CR stores, e.g., 25 wafers W. Wafers W are taken out one by one by the sub-arm mechanism 21 from the cassette CR. The sub-arm mechanism 21 can gain access to an alignment unit (ALIM) and an extension unit (EXT) belonging to a third processing unit G3 of the processing section 11 (described later).

The processing section 11 has a plurality of heating units, a plurality of liquid processing units, and a main arm mechanism 22. The main arm mechanism 22 is provided at the center of the processing section 11. A plurality of processing units are arranged so as to surround the main arm mechanism 22. As shown in FIG. 1, at most five processing unit groups G1, G2, G3, G4 and G5 may be arranged in the coating/developing system 1 of this embodiment. A first and second processing units G1, G2, are arranged in a front side of the system 1. A third processing unit G3 is arranged near the cassette section 10. A fourth processing unit G4 is arranged near the interface section 12. A fifth processing unit G5 is arranged at a rear side of the system 1.

Figure 2:
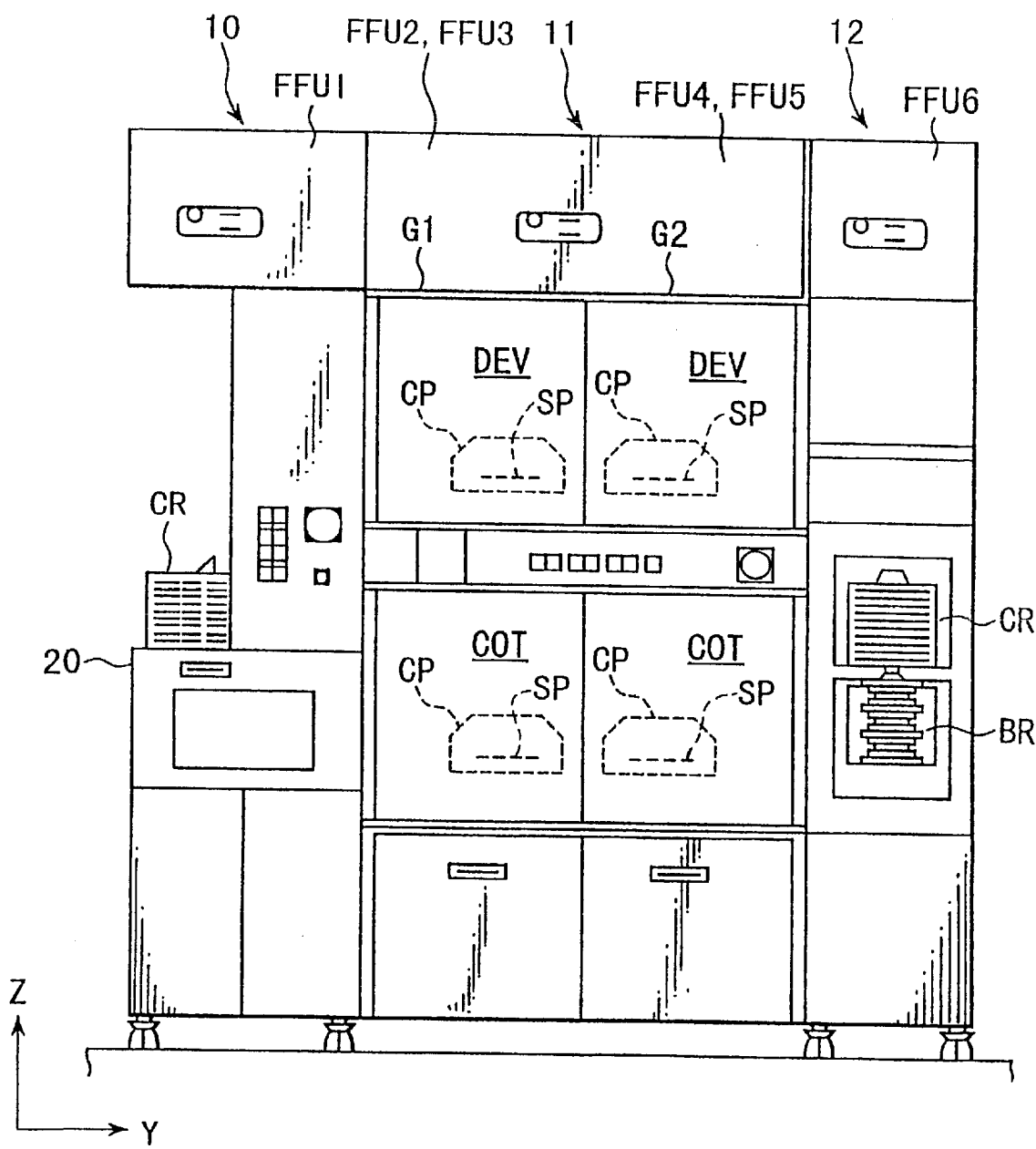
FIG. 2 is a front view of the substrate processing apparatus.

As shown in FIG. 2, the first and second processing units G1, G2 are set at the front side of the processing system 1. The first processing units GI and the second processing unit G2 have substantially the same structure. The first and second processing units G1, G2 have two spinner type liquid processing units (COT and DEV), each having a cup CP and a spin chuck SP. In the COT, a resist solution is coated onto the wafer W. In the unit DEV, the coated resist is developed. The cup CP and the spin chuck SP are equipped with temperature controlling mechanisms (not shown), individually. Temperatures of cup CP and the spin chuck SP are controlled by the temperature controlling mechanisms so as to set each of temperatures of the resist solution, the developing solution and the wafer W at a predetermined temperature (desired temperature). Such a temperature controlling mechanism has an electrical resistance heater and a peltier element whose operations are controlled by the control sections 111 to 11n of a power supply controlling circuit 200 (described later).

Note that the resist coating unit (COT) is positioned below the developing unit (DEV). With this structure, the discharge solution discharged from the resist coating unit (COT) can be easily handled and labor required for maintenance work of the resist coating unit (COT) can be reduced. However, the arrangement of the liquid processing units (COT) and (DEV) is not limited to this and may be modified if necessary.

Figure 3:
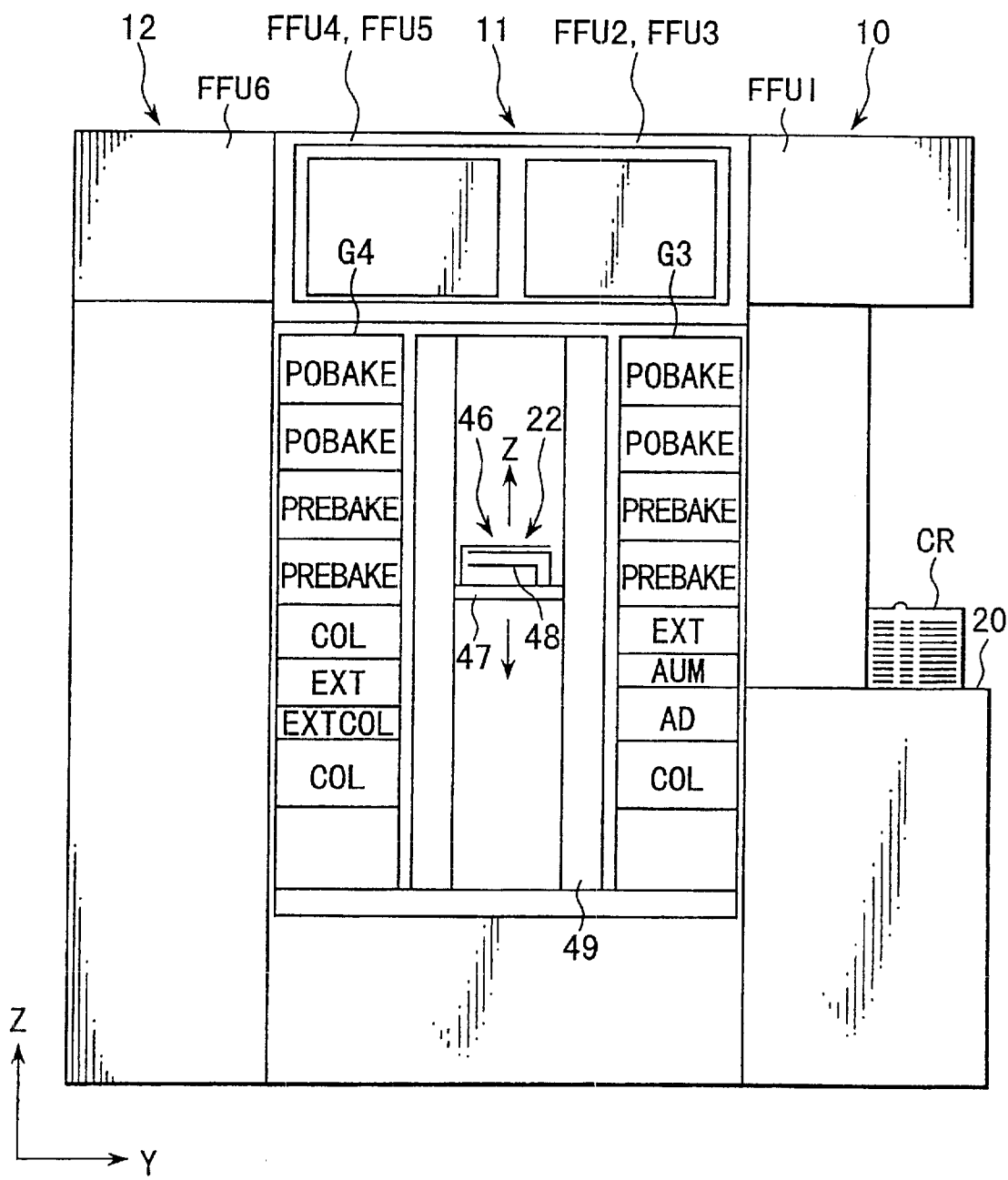
FIG. 3 is a back view of the substrate processing apparatus.

As shown in FIG. 3, the main arm mechanism 22 has a wafer transfer device 46 and a cylindrical supporting body 49. The wafer transfer device 46 is rotatably supported inside the cylindrical supporting body 49. The cylindrical supporting body 49 is connected to a rotation shaft of a motor (not shown). The cylindrical supporting body 49 and the wafer transfer device 46 are synchronously rotated about the rotation shaft of a motor by an angle of θ. Note that the cylindrical supporting body 49 may be connected to another rotation shaft (not shown) to be rotated by the motor. The wafer transfer device 46 has a plurality of wafer holding portions 48 movable back and forth along a transfer table 47. The wafer W is held by the wafer holding portion 48.

As shown in FIG. 3, the third processing unit group G3 has a plurality of open-type processing units in which treatment is applied to the wafer W mounted on a table (not shown). These open-type processing units are stacked vertically and tandemly in eight stages. For example, a cooling unit (COL), adhesion unit (AD), alignment unit (ALIM), extension unit (EXT), two prebaking units (PREBAKE), two post baking units (POBAKE) are stacked in this order from the bottom. The fourth processing unit group G4 has a plurality of open-type processing units in which treatment is applied to the wafer W mounted on a table (not shown). These open-type processing units are stacked vertically tandemly in eight stages. For example, a cooling unit (COL), an extension cooling unit (EXTCOL), an extension unit (EXT), a cooling unit (COL), two prebaking units (PREBAKE), two post baking units (POBAKE) arc stacked in this order from the bottom.

The cooling unit (COL) and the extension cooling unit (EXTCOL) operated at low temperatures are placed in lower stages, whereas the prebaking unit (PREBAKE), the post-baking unit (POBAKE), and adhesion unit (AD) operated at higher temperatures, are arranged in upper stages. It is therefore possible to eliminate mutual thermal interference between units. Since the peltier element is buried in a cooling plate of the cooling unit (COL) and the extension cooling unit (EXTCOL), the wafer W mounted on the cooling plate is cooled. On the other hand, an electrical resistance heater is buried in a hot plate of the prebaking unit (PPREBAKE), the post baking unit (POBAKE) and the adhesion unit (AD). Therefore, it is possible to heat the wafer W on the hot plate. The operations of the electrical resistance heater and the peltier element are independently controlled by the control sections 111-11n of the power supply controlling circuit (described later).

As shown in FIG. 1, the interface section 12 has the same size as the processing section 11 in the X-axis direction, but smaller in the Y-axis direction. In the front side of the interface section 12, a movable pick-up cassette CR and an unmovable buffer cassette BR are arranged vertically in two stages. On the other hand, a peripheral light exposing apparatus 23 is arranged in a backside portion of the interface section 12. Furthermore, a second sub-arm mechanism 24 is provided at the center of the interface section 12. In the second sub-arm mechanism 24 has a wafer holding portion and a back-and-forth moving mechanism, an X-axis moving mechanism for moving the wafer holding portion in the X-axis direction, a Z-axis moving mechanism for moving the wafer holding portion in the Z-axis direction, and a θ rotation mechanism for rotating the wafer holding portion about the Z-axis. The second sub-arm mechanism 24 can gain access to an extension unit (EXT) and wafer transfer table (arrange near the light exposure apparatus, but not shown) belonging to the fourth processing unit group G4.

As indicated by two-dot/dash line in FIG. 1, the fifth processing unit group G5 is arranged at the back side of the main arm mechanism 22. Multiple-stage units of the fifth processing unit group G5 are movable in the Y-axis direction along a guide rail 25. When the fifth processing unit group G5 is moved along the guide rail 25, a space is ensured in the back side of the main arm mechanism 22. The presence of the space makes it easier to perform maintenance operation of the main arm mechanism 22.

Figure 4:
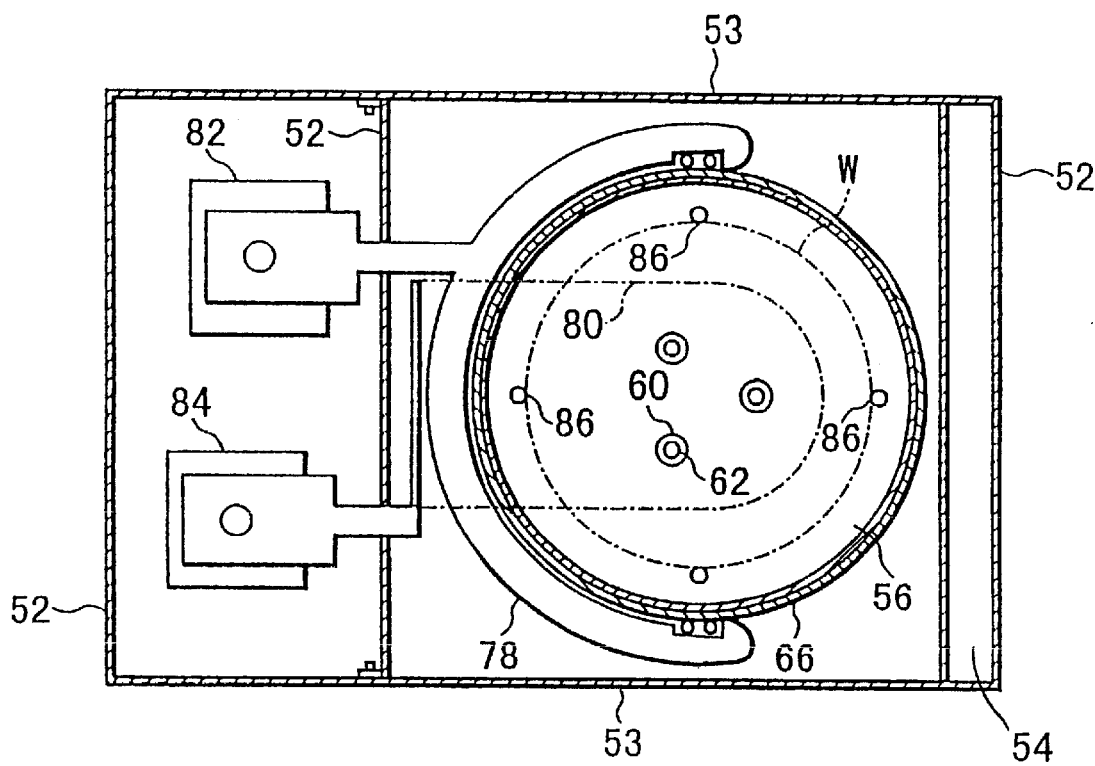
FIG. 4 is a plan view of a heating unit (baking unit) provided in the substrate processing apparatus.
Figure 5:
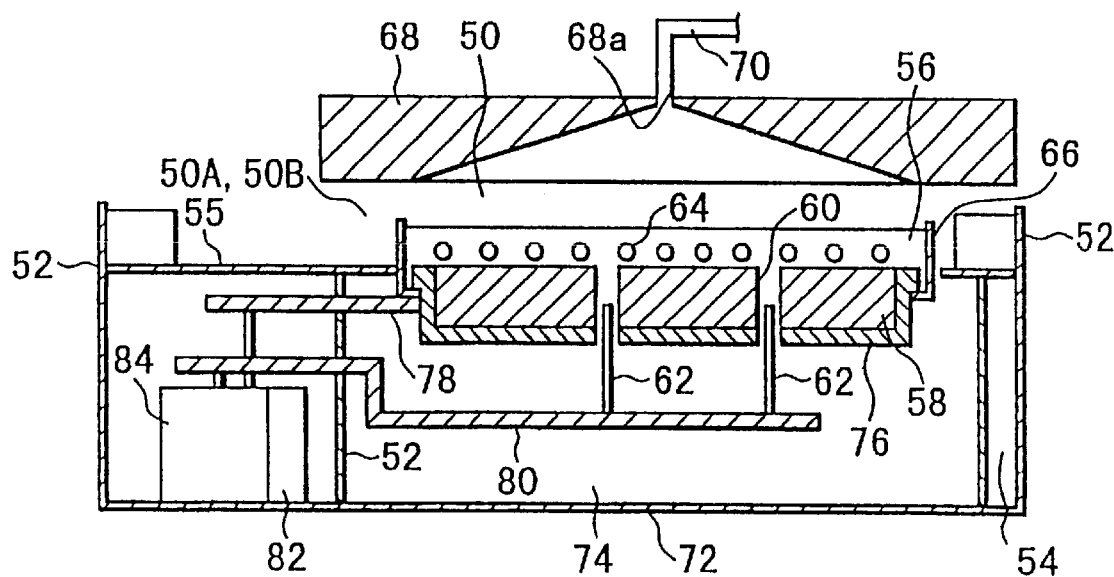
FIG. 5 is a vertical sectional view of the heating unit (baking unit)

Next, we will explain each of the baking units (PREBAKE), (POBAKE) belonging to the third and fourth processing units groups G3, G4, with reference to FIGS. 4 and 5. Note that a horizontal shield plate 55 is omitted in FIG. 4.

The process chamber 50 of the baking unit is composed of both side walls 53 and the horizontal shielding plate 55. Openings 50A and 50B are formed at the front side (near passage side of the main arm mechanism 22) and the back side of the process chamber 50. A circular opening 56 is formed at a center portion of the shielding plate 55. A disk-shape hot plate 58 housing a heater is provided in the opening 56.

The hot plate 58 has three holes 60, for example. In each of the holes 60, a supporting pin 62 is movably inserted. At the time the wafer W is loaded/unloaded, the supporting pins 62 project or ascend upwardly from the surface of the hot plate 58 to thereby transfer the wafer between the main arm mechanism 22 and the holding member 48.

In the outer periphery of the hot plate 58, ring-band form shutter 66 is provided having numerous ventilation holes along the circumference at intervals corresponding to an angle of about 2°. The shutter 66 is retracted from the hot plate 58 at the normal state. During the heating operating, the shutter 66 is ascended to a position higher than the upper surface of the hot plate 58, as shown in FIG. 5, to thereby form a ring-form side wall between the hot plate 58 and the cover member 68. A clean-air down-flow introduced from the front side of the apparatus is thereby allowed to flow uniformly in the peripheral direction through the ventilation holes 64.

An exhaust port 68a is provided at the center of a covering member 68, for exhausting gas generated from the surface of the wafer W during the heating operation. An exhaust pipe 70 is connected to the exhaust port 68a. The exhaust pipe 70 is communicated with either a duct 54, which is positioned at the front side (near a passage of the main arm mechanism 22) of the apparatus, or a duct not shown.

Below the shielding plate 55, a machinery chamber 74 is formed of the shielding plate 55, both side walls 53 and a bottom plate 72. In the machinery chamber, a hot-plate supporting plate 76, a shutter arm 78, a supporting pin arm 80, a shutter arm elevating cylinder 82, the supporting pin arm elevating cylinder 84, are placed.

As shown in FIG. 4, wafer-guiding supporting projections 86 are provided at a site of the surface of the hot plate 58 corresponding to the peripheral portion of the semiconductor wafer W to be mounted thereon. A power distribution circuit (not shown) for supplying power is connected to the hot plate 58. Note that a switch (not shown) is connected to each of the hot plates 58 (or power supply circuits). Furthermore, a temperature sensor (not shown) is provided at each of the hot plates for detecting temperature of the hot plate. On the basis of the temperature of the hot plate detected by the temperature sensor, the control sections 111, 112 (described later) control the switches in an ON/OFF manner. These temperature sensors are incorporated in the power supply controlling circuit 200 (described later).

Figure 6:
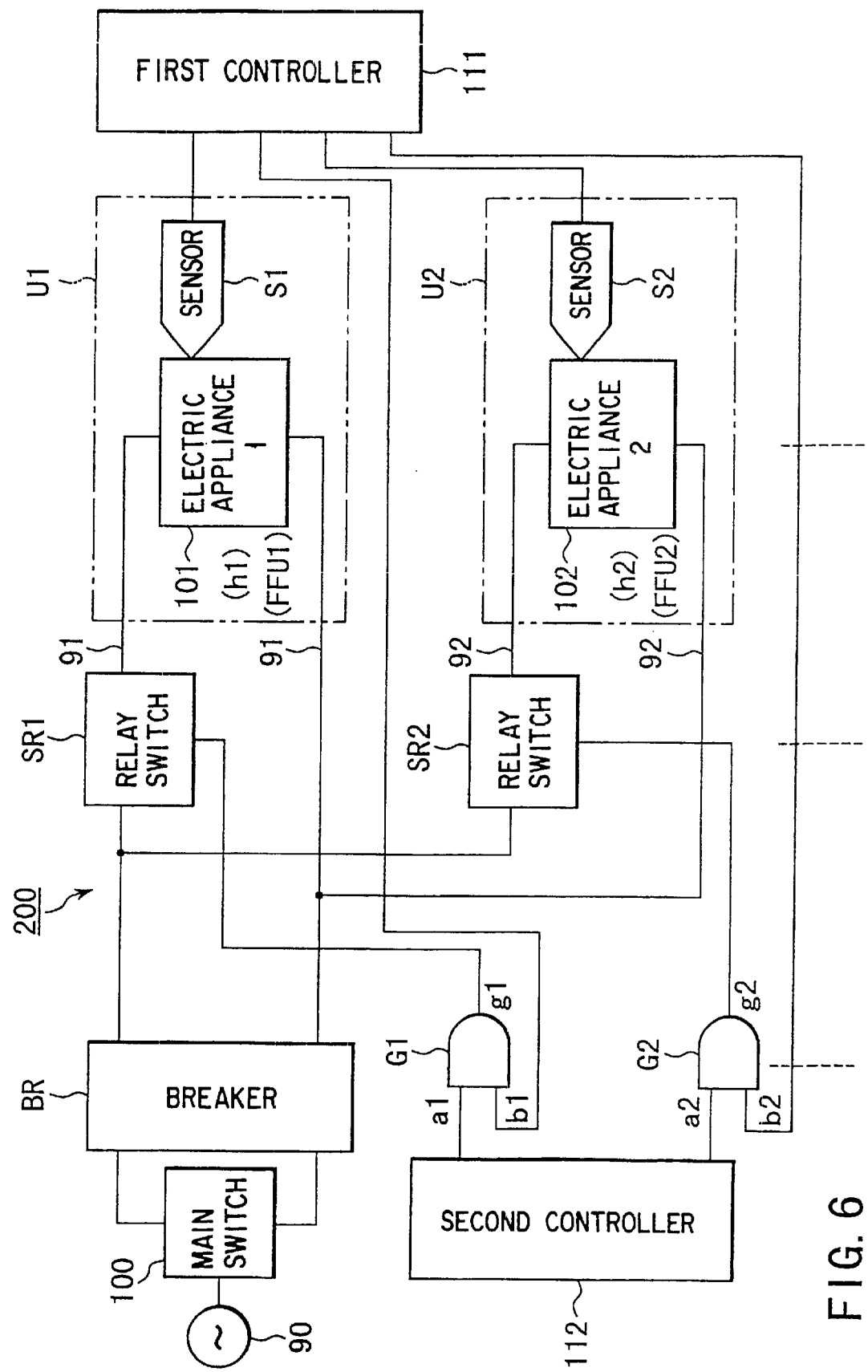
FIG. 6 is a control circuit diagram of the substrate processing apparatus according to an embodiment of the present invention.

Now, the power supply controlling circuit 200 for electric appliances will be explained with reference to FIG. 6.

As the electric appliances in the processing system 1 of this embodiment, there are FFU, the heating mechanism or cooling mechanism of the thermal processing unit, and the temperature controlling mechanism of the liquid processing unit.

The power supply controlling circuit 200 has processing units U1 to Un (n represents the total number of the units). Electric appliances 101 to 10n are provided correspondingly on the processing units U1 to Un. As the electric appliances 101-10n, fan-driving motors of FFU, a temperature controlling heater (not shown) of the cup CP, a wafer heating heater (not shown) and a wafer cooling heater (not shown), may be mentioned. For example, in the case where the electric appliances 101 to 10n are the fan-driving motors (not shown) of FFU, a first processing unit U1 corresponds to FFU1, a second processing unit U2 corresponds to FFU2, and an n-th processing unit Un corresponds to FFU6. Alternatively, when the electrical appliances 101 to 10n are wafer heating heaters, the first processing unit U1 is the prebaking unit (PREBAKE) and the second processing unit U2 is the post baking unit (POBAKE). An n-th processing unit Un corresponds to an adhesion unit (AD).

Power is supplied to these processing units U1 to Un respectively from power supply 90 by way of the power distribution circuits 91 to 9n. A main switch 100 is provided between the power supply 90 and each of circuit 91 to 9n. The power supply to the processing unit U1 to Un is controlled by the main switch 100 in an ON/OFF manner.

The power supply controlling circuits 200 for electric appliances has the control sections 111 to 11n. The first control section 111 is connected to the power distribution circuit 91 by way of an AND-type gate element (hereinafter, simply referred to as "gate") G1 and a relay switch SR1. The second control section 112 is connected to the power distribution circuit 91 by way of gates G1, G2 and relay switches SR1, SR2.

In the processing units U1 to Un, heaters h1 to hn are installed as the electric appliance, respectively. The heaters h1 to hn are connected to the power supply 90 respectively by way of n number of lines 91 to 9n. A breaker BR is positioned near the power supply 90 and connected to the power supply. The breaker BR shuts out the current supply from the power supply 90 when a large amount of current in excess of a predetermined value is supplied to the circuit.

The relay switches SR1 to SRn are respectively provided in the middles of the lines 91 to 9n. The relay switches SR1 to SRn participate open/close between the heater h1, h2 and the power supply 90.

Input terminals for inputting driving signals into the relay switches SR1 to SRn are connected to the AND type gate elements (hereinafter, simply referred to as "gate") G1-Gn and output signals g1-gn, respectively.

Terminals b1-bn, which is one of the two input terminals of the gate G1-Gn, are connected to the output side of the first control section 111. Onto the input sides of the first control section 111, temperature sensors S1-Sn for detecting temperatures of the heaters h1-hn are respectively connected. The temperature sensors S1 to Sn input signals corresponding to temperatures of the heaters h1-hn to one (b1 to bn) of the input terminals of the gates G1 to Gn.

The other input terminals a1-an of the gates G1-Gn are connected to the output side of the second control section 112, individually. Data for operation timing of the processing units U1-Un has been stored in the second control section 112. The signals for the operation timing of the heaters h1-hn are output from the data and input into the input terminals a1-an of the gates G1-Gn.

In the first control section 111, each of temperatures of the heaters h1-hn detected by the sensors S1-Sn is compared to the predetermined temperature. Only when the detected heater temperature is higher than the predetermined temperature, signal "1" is sent to the input terminal of the gate corresponding to the heater. The term "predetermined temperature" used herein is a heater temperature when the wafer temperature is optimum. The heater temperature is determined on the basis of the relationship between the wafer temperature and heater temperature, which has been obtained by actually heating a dummy wafer and a product wafer.

The second control section 112 sends signal "1" directing "switch-on" to each of the input terminals a1-an of the gates G1-Gn sequentially at time intervals during the start-up time of the apparatus (the main switch 100 is turned on). Since the signal "1" is sent sequentially at time intervals, the start-up timing for the heaters can be staggered. To describe more specifically, the time period from initiation of current supply to one of the heaters until the temperature of the heater reaches to a predetermined temperature and the first control section is actuated to permit current to flow intermittently, can be staggered between n number of heaters.

Figure 7:
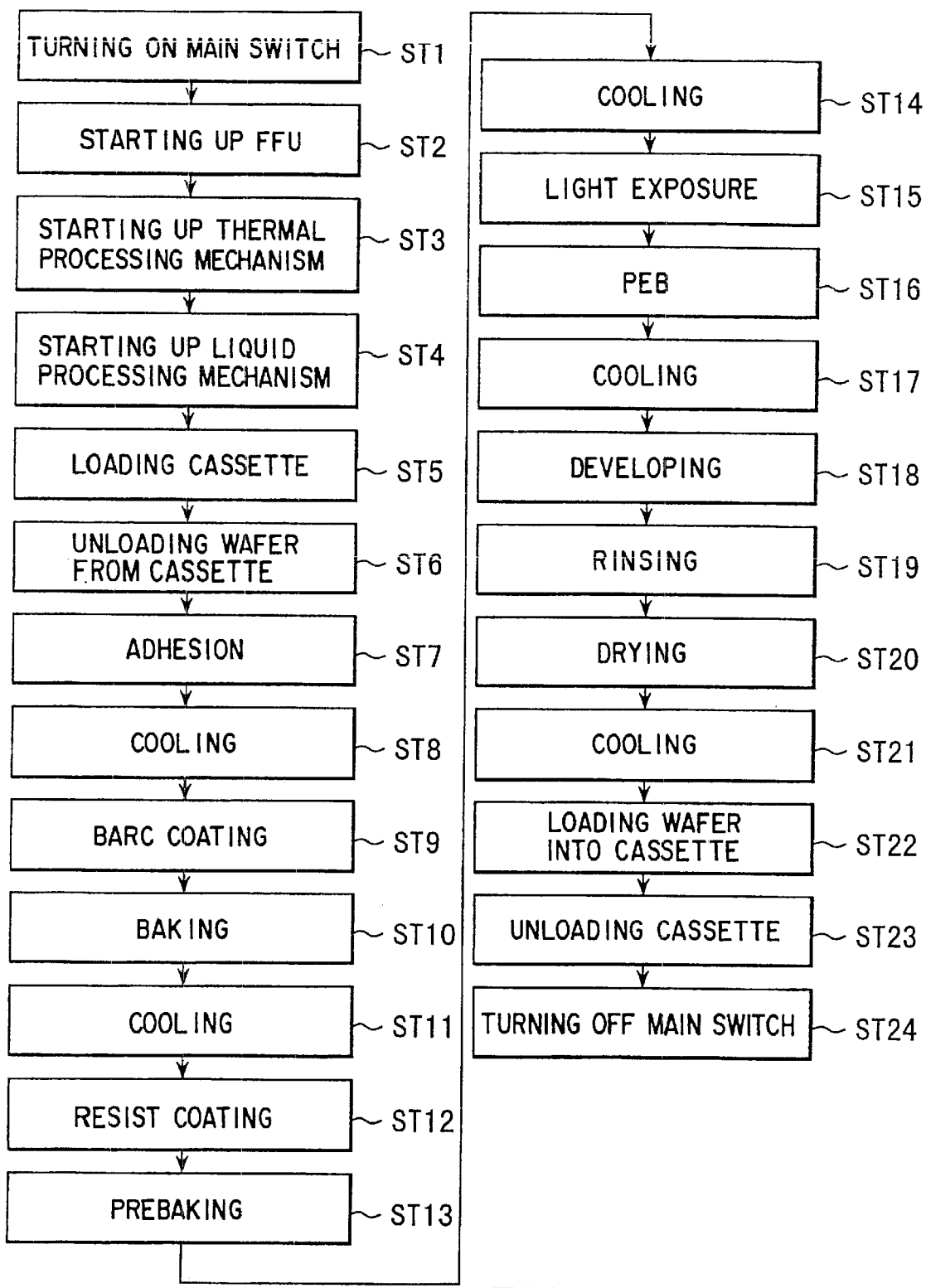
FIG. 7 is a flow chart showing the steps of a substrate processing method using the substrate processing apparatus according to an embodiment of the present invention.

Next, we will explain how to process the semiconductor wafer W by the aforementioned apparatus with reference to FIG. 7.

First, the main switch 100 is turned on (Step ST1). Current is supplied from the power supply 90 to the power supply controlling circuit 200. Electric appliances arranged in the processing system 1, are then actuated. More specifically, FFU1, 2, 3, 4, 5, 6, are driven sequentially in this order (Step ST2). The heating mechanisms and cooling mechanisms of the thermal processing unit are sequentially driven in the order to be used (Step ST3). Furthermore, cup/spin chuck temperature controlling mechanisms of the liquid processing unit are sequentially driven in the order to be used (Step ST4). The electric appliances are staggered to drive so that excessive power is not consumed in the beginning and the excessive load is not applied to the breaker BR.

The cassette CR is loaded into the cassette section 10 (Step ST5). The wafer W is unloaded from the cassette CR by the sub-arm mechanism 21 (Step ST6). Furthermore, the sub-arm mechanism 21 transports the wafer W to the alignment unit (ALIM) of the processing section 11 to align the wafer W with the main arm mechanism 22.

The main arm mechanism 22 transports the wafer W from the alignment unit (ALIM) to the adhesion unit (AD). In the adhesion unit (AD), the wafer W is heated while applying an HMDS vapor onto the wafer surface (Step ST7). As a result, the wafer is hydrolyzed. The wafer W is transported to the cooling unit (COL) to cool the wafer to approximately room temperature (Step ST8).

The wafer W is transported to the coating unit (COT) and then coated with a bottom anti-reflective coating solution to form a BARC film (Step ST9). Subsequently, the wafer W is transported to the prebaking unit (PREBAKE) and heated to bake the BARC film (Step ST10). Then, the wafer W is transported to the cooling unit (COL) and cooled to approximately room temperature (Step ST11).

The wafer W is transported to the resist coating unit (COT) and coated with a resist solution to form a resist film (Step ST12). As the resist, for example, a chemical amplified resist may be employed. Subsequently, the wafer is transferred to the prebaking unit (PREBAKE) and heated to prebake the resist film (Step ST13). The wafer W is transferred to the cooling unit (COL) and cooled to approximately room temperature (Step ST14).

The main arm mechanism 22 transports the wafer W to the interface section 12 and then transferred to the second sub-arm mechanism 24. The second sub-arm mechanism 24 transfers the wafer W to a transport machine near the light exposure apparatus. Thereafter, the wafer W is loaded into the light-exposure apparatus to pattern-expose the resist coated film (Step ST15).

After completion of the light exposure, the wafer W is returned to the processing section and then loaded into the postbaking unit (POBAKE), in which the wafer W is subjected to post exposure baking (PEB)(Step ST16). The wafer W is transported into the cooling unit (COL) to cool the wafer W to approximately room temperature (Step ST17).

The wafer W is transported to the developing unit (DEV). A developing solution is poured onto the wafer W to develop the pattern-exposed resist coating film (Step ST18). Subsequently, pure water is poured onto the wafer W to rinse the resist coating film (Step ST19). Furthermore, the wafer W is rotated at a high speed to remove a moisture component from the wafer W. Thereafter, the wafer W is transported to the baking unit (PEB) to dry the wafer W (Step ST20). The wafer W is transported to the cooling unit (COL) to cool the wafer W to approximately room temperature (Step ST21).

The wafer W is transferred from the main arm mechanism 22 to the sub-arm mechanism 21 and then the wafer W is stored into the cassette CR (Step ST22). When the cassette CR is filled with the processed wafers W, the entire cassette CR containing the wafers W is unloaded from the processing system 1 (Step ST23). After completion of all processing of the wafer W, the main switch 10 is turned off (Step ST24).

Figure 8:
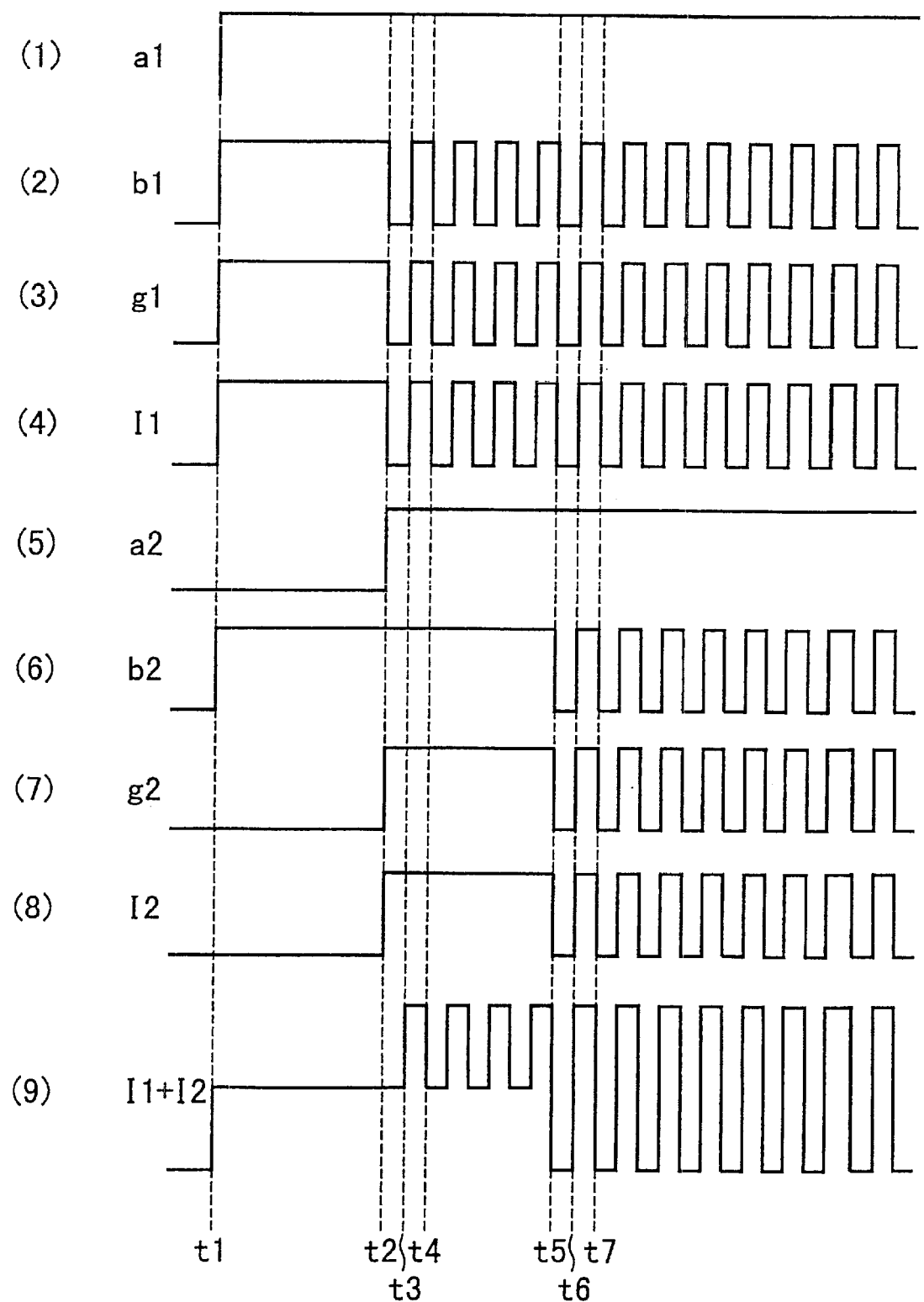
FIG. 8 is a timing chart showing each of operations of a gate, a control section, and an electrical appliance.

Then, we will explain how to supply electric power to the hot plate (Step ST3) of the baking units with reference to the timing chart of FIG. 8.

When the main switch 100 is turned on to start up the substrate processing apparatus, current is supplied from the power supply 90 not only to the circuits 91 to 9n but also to the first control section 111 and the second control section 112 by way of another circuit (not shown).

At the time point t1 the main switch 100 is turned on, temperatures of the heaters h1, h2 are virtually equal to ambient temperature. Therefore, the first control section 111 identifies that temperatures of the heaters are lower than the predetermined temperature, on the basis of the detection signals for these heaters. Subsequently, the first control section 111 sends the signal "1" to the input terminals b1 and b2 of the gates G1 and G2, respectively, thereby turning on the switches of the heaters h1, h2. In brief, the terminals b1, b2 of the gates G1, G2 are receive signal "1" instructing "switch-on" when the apparatus is started up.

On the other hand, when the main switch 100 is turned on, the second control section 112 sends the switch-on signal "1" toward the input terminals a1, a2 of the gates G1, G2 sequentially at different time points. For example, the switch-on signal "1" is first sent only to the gate G1, and then, the switch-on signal "1" is sent to the gate G2 after a predetermined time.

In this manner, at the time point t1 when the main switch is turned on, the signal "1" is input simultaneously into the input terminals a1, b2 of the gate G1, as shown in the charts (1) and (2) of FIG. 8.

At this time, as shown in the chart (3) of FIG. 8, since the operational conditions of the gate G1 are satisfied, the switch-on signal "1" is sent from the output terminal g1 of the gate G1 to the relay switch SR1.

When the signal "1" is input into the input terminal of the relay switch SR1 connected to the output terminal g1, the relay switch SR1 starts working to link the connecting point. As a result, current is supplied from the power supply 90 to the heater h1, as shown in the chart (4) of FIG. 8.

On the other hand, in the gate G2, the signal "1" is not sent from the second control section 112 to the input terminal a2 at the time t1. Therefore, the gate G2 remains under control of the signal "0". As shown in charts (5) and (6) of FIG. 8, the input signal "1" is sent from the first control section 111 to the input terminal b2.

Since the operation conditions of the gate G2 are not satisfied, the switch-on signal "1" is not sent to the relay switch SR2 from the output terminal g2 of the gate G2. Hence, the relay switch SR2 connected to the output terminal g2 is not actuated. No current is supplied from the power supply 90 to the heater h2, as shown in the chart (8) of FIG. 8.

As shown in the chart (4) of FIG. 8, the relay switch SR1 is maintained while linking connecting point during the period from time t1 to time t2. During this period, the heater h1 is continuously heated. At the time t2, temperature of the heater h1 reaches the predetermined temperature. The temperature of the heater h1 is detected by the sensor S1 and the detection signal is sent to the first control section 111. The first control section 111 recognizes that the temperature of the heater h1 has reached the predetermined temperature and therefore determined that heating is no longer necessary to continue. Accordingly, the signal "1" to be sent to the terminal b1 of the gate G1, is terminated.

On the other hand, the terminal a1 of the gate G1 is maintained under control of the signal "1" after the timepoint t1. When the signal "1" is not sent to the terminal b1, the operation conditions of the gate G1 are not satisfied. Consequently, the output terminal g1 of the gate G1 comes to the "0" state. If so, the relay switch SR1 leaves from the connecting point, with the result that current does not flow the heater h1 during the time period from t2 to t3, as shown in the charts (2), (3), and (4) of FIG. 8.

When the temperature of the heater h1 decreases with the passage of time, the temperature of the heater h1 is detected by the sensor S1 and the detection signal is sent to the first control section 111. When the first control section 111 recognizes that temperature of the heater h1 has decreased, the signal "1" is sent again to the terminal b1 of the gate G1. As a result, the operation conditions of the gate G1 are satisfied. The signal "1" is therefore sent to the relay switch SR1 from the terminal g1. The relay switch SR1 is linked to the connecting point during the time period from point t3 to t4, current flows through the heater h1, as shown in the charts (2), (3), and (4) of the FIG. 8.

In this way, the input signal to the terminal b1 of the gate Gi reciprocates between "0" and "1" depending upon temperature change of the heater h1. In accordance with this change, current $I_1$ flowing through the heater h1 changes intermittently. The state in which current $I_1$ changes intermittently after the time point t2, is a so-called stable state. The amount of electric power after the time point t2 is lower than that consumed from the time t1 to t2, as shown in the chart (4) of FIG. 8.

Now, we will focus on the charts (6), (7) and (8) of FIG. 8 corresponding to the operation of the heater h2.

At the time point t2 at which the heater comes to the stable state, the signal "1" is sent from the second control section 112 to the terminal a2 of the gate G2. As shown in the chart (6) of FIG. 8, since the signal "1" is input into the terminal b2 of the gate G2 after time point t1, if the signal "1" is sent to the terminal a2 of the gate G2 at the time t2, the operation conditions of the gate G2 are satisfied, as shown in the charts (6), (7) of FIG. 8. As a result, the signal "1" is sent to the output terminal g2.

When the signal "1" is sent to the output terminal g2 of the gate G2, the relay switch SR2 receives signal "1" and then actuated. Current $I_2$ flows through the heater h2 during time period from t2 to t5, as shown in the chart (8) of FIG. 8.

The signal "1"is continued to be sent from the first control section 111 to the input terminal b2 of the gate G2 during the period from time t2 to t5 until temperature of the heater h2 reaches the predetermined value. The current $I_2$ therefore flows continuously during the period of t2 to t5, as shown in the chart (8) of FIG. 8. When the temperature of the heater h2 reaches the predetermined value at the time t5, the detection signal sent from the sensor S2 is input into the first control section 111. When the first control section 111 recognizes that the temperature of the heater h2 has decreased, the signal "1" is sent to the terminal b1 of the gate G1. If so, the operation conditions of the gate G1 are satisfied and the signal "1" is sent from the terminal g1 to the relay switch SR1. The first control section 111 determines that further heating is not necessary and terminates output of the signal "1" to the input terminal b2 of the gate G2. If terminated, the operation conditions of the gate G2 are no longer satisfied and therefore the signal "0" is sent out to the output terminal g2. When the relay switch SR" receives the signal "0", the relay switch SR removes from the connecting point. Hence, current no longer flows through the heater h2, as shown in the chart (8) of FIG. 8.

Thereafter, when the temperature of the heater h2 decreases at the time point t6, the first control section 111 recognizes, by the assistance of the sensor S2, that the temperature of the heater h2 has decreased, and sends the signal "1" to the input terminal b2 of the gate G2. Then, the signal "1" is sent again to the output terminal g2 of the gate G2. The relay switch SR2 receives the signal "1" and links again to the connecting point, thereby permitting current $I_2$ to flow through the heater h2, as shown in the charts (6), (7), (8) of FIG. 8.

In this way, the signal to be sent from the first control section 111 to the input terminal b2 of the gate G2 reciprocates between "1" to "0", depending upon the temperature of the heater h2. The current $I_2$ flowing through the heater h2 changes intermittently in accordance with the change in signal (see charts (6), (7) and (8)).

In the stable state (constant state) after time point t5, at which the current $I_2$ changes intermittently, power consumption after t5 is lower than that from tl to t5, as shown in the chart (8) of FIG. 8.

The chart (9) of FIG. 8 is a timing chart showing the sum of the current $I_1$ (flowing through the heater h1) and current $I_2$ (flowing through the heater h2). As shown in the chart (9), only the current $I_1$ is supplied in the period of time t1 to t2 and therefore its power consumption is equivalent to the amount consumed by the heater h1.

During the time period of t2 to t5, since current flows through not only the heater h1 but also the heater h2, a total amount of the current becomes large. After the heater h1 comes into the stable state after the time t2 and the current flows intermittently. Therefore, the current flowing through the heater h1 is reduced. The total current is equivalent to the value obtained by adding the small current required for maintaining the stable stage of the heater h1 to the current required for driving the heater h2. This total current is smaller than the amount of current required for driving two heaters h1, h2, simultaneously.

Furthermore, after the time point t5, two heaters enter the stable state simultaneously, the amount of the required current is further reduced.

In this way, the timing of power supply is controlled so as not to overlap with each other in the cases of the heater h3 to the n-th order heater hn. The large amount of current is not supplied to a plurality of heaters at the same time.

According to embodiments, it is possible to prevent a large amount of power from being consumed at the time the apparatus is started up.

As a result, it is possible to use a breaker BR and an electric cable whose power consumption is nearly two times larger than that of a normal operation time. As a result, the manufacturing cost is reduced. In addition, such a breaker can work properly when an abnormal situation takes place, security control during the normal operation time can be efficiently ensured.

Note that the present invention is not limited to the content of the embodiment.

The prebaking unit differs from the post baking unit in processing conditions such as the predetermined temperature. It is therefore possible to stagger the timing of terminating power supply depending upon the types of heating units.

Moreover, power-supply initiation time to the heaters hl to hn may be directly controlled by the control sections 111 to 11n in place of the gates G1 to Gn.

Furthermore, the power-supply initiation time of the heaters h1-hn may be controlled depending upon the usage order of the processing units U1-Un.

In the aforementioned embodiment, the apparatus for processing the semiconductor wafer has been explained. The present invention is not limited to this embodiment and may be applied to an apparatus for processing the LCD substrate.

According to the present invention, the starting up times of individual heating means, at which power is continuously supplied to each of the heating means, do not converge on one time. It is therefore possible to prevent a large power consumption at the time the apparatus is started up.

According to the present invention, the starting up times of individual heating means, at which power is continuously supplied to each of the heating means, do not converge on one time. It is therefore possible to prevent a large power consumption at the time the apparatus is started up. In addition, it is not necessary to supply power to the heating means to be used in a later step, at the time earlier than required. Hence, power consumption can be saved.

According to the present invention, the starting up times of individual heating means, at which power is continuously supplied to each of the heating means, do not converge on one time. It is therefore possible to prevent a large power consumption at the time the apparatus is started up.

According to the present invention, the starting up times of individual heating means, at which power is continuously supplied to each of the heating means, do not converge on one time. It is therefore possible to prevent a large power consumption at the time the apparatus is started up. In addition, it is not necessary to supply power to the heating means to be used in a later step, at the time earlier than required. Hence, power consumption can be saved.

Furthermore, the apparatus of the present invention has constructed by adding an on-off regulation means to the conventionally used on-off controlling device. The on-off regulation means regulates each of the switches for the heating means not to be "turned on" at the starting-up time of the apparatus. The on-off controlling device controls "on-off" of the switches on the basis of their temperatures of the heating means. It is therefore possible to prevent a large power consumption at the start-up time only by adding the regulation means but modifying the structure of the conventionally-used apparatus drastically.

According to the present invention, the regulation means for canceling a "turn-on" state in each of switches while staggering its canceling time. It is therefore possible that start-up times of a plurality of heating means, at which power is continuously supplied to each of the heating means, do not converge on one time. As a result, it is possible to prevent a large amount of power from being consumed at the startup time of the apparatus.

According to the present invention, the regulation means for canceling a "turn-on" state on the basis of the usage order of the heating means. The starting-up times of the heating means, at which power is continuously supplied to each of the heating means, do not converge on one time. As a result, it is possible to prevent a large power consumption at the start-up time of the apparatus. In addition, it is not necessary to supply power to the heating means whose operation is carried out in a later step, at the time earlier than required. It is therefore possible to save power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus for use in a photolithographic process for coating resist onto a substrate and developing the coated resist, comprising:
   a power supply equipped with a main switch which is turned-on and turned-off;
   a plurality of electric appliances operated substantially in the same manner when power is supplied from the power supply, said electric appliances including a plurality of air conditioners;
   a power distribution circuit that supplies power to each of the plurality of electric appliances; and
   a control section connected to the power distribution circuit, for determining a power supply order for supplying electric power to said electric appliances on the basis of data for a usage order of the electric appliances and controlling power-supply timing to the plurality of electric appliances, according to the power supply order;
   wherein said control section staggers power-supply initiation timing to each of the electric appliances based on the power supply order when the main switch is turned on.

2. The apparatus according to claim 1, wherein each of said electric appliances has a heater for heating the substrate.

3. The apparatus according to claim 1, wherein each of said electric appliances has a cooler for cooling the substrate.

4. The apparatus according to claim 1, wherein each of said electric appliances has a temperature controlling mechanism for controlling temperature of a processing solution for processing the substrate.

5. The apparatus according to claim 1, further comprising a plurality of processing units each having one of the electric appliances, wherein at least two of the plurality of processing units have a heating mechanism.

6. The apparatus according to claim 5, wherein said control section supplies power to each of the heating mechanisms in accordance with the usage order of the heating mechanisms.

7. The apparatus according to claim 1, wherein the electrical appliances include,
   a plurality of heating units, and
   a plurality for cooling units and a plurality of cup/spin chuck temperature-controlling units,
   wherein the control section staggers power supply initiation timing to each of the heating units and cooling units and cup/spin chuck temperature-controlling units.

8. A substrate processing apparatus for use in a photolithographic process for coating resist onto a substrate and developing a coated resist, comprising:
   a power supply equipped with a main switch which is turned-on and turned-off,
   a plurality of thermal processing units that heat or cool the substrate each having a heater which receives power supplied from the power supply;
   memory that stores a predetermined optimal temperature of a substrate based on a correlation between a temperature of the substrate heated by the heater and the temperature of the heater;
   a power distribution circuit equipped with a plurality of relay switches that turn on/off power supply to each of the plurality of thermal processing units;
   temperature detectors that detect temperatures of each of the thermal processing units;
   a first controller that receives signals of the detection temperature from the temperature detectors, retrieves the predetermined temperature from the memory, and compares each of the detection temperatures with the predetermined temperature;
   a second controller that stores operation timing data of thermal processing units;
   a plurality of AND type gate elements, each of which is associated with a thermal processing unit whose input side connects to the first and second controller and whose output side connects to one of the plurality of relay switches,
   wherein the first controller sends a switch-on instruction signal to a first one of the plurality of AND type gate elements when the detection temperature is higher than the predetermined temperature;
   the second controller sends a switch-on instruction signal to the first AND type gate element on the basis of the operation timing of the heat processing units; and the first AND type gate element sends a switch-on instruction signal to one of the plurality of relay switches only when the first AND type gate element receives the switch-on instruction signals from both the first and second controllers.

9. The apparatus of claim 8, wherein said second controller prevents turn-on of each of the relay switches of the power distribution circuit and releases the turn-on prevention in accordance with usage order of the thermal processing units.

* * * * *

UNITED STATES PATENT AND TRADEMARK OFFICE
CERTIFICATE OF CORRECTION

PATENT NO. : 6,311,091 B1  Page 1 of 1
DATED : October 30, 2001
INVENTOR(S) : Yutaka Yamahira It is certified that error appears in the above-identified patent and that said Letters Patent is hereby corrected as shown below:

<u>Title page, Item [54] and Column 1, lines 1-4,</u>
Title should read -- SUBSTRATE PROCESSING APPARATUS WITH POWER DISTRIBUTION CONTROL FOR REDUCED POWER CONSUMPTION DURING APPARATUS START UP --.
Item [73] Assignee, should read -- Tokyo Electron Limited Tokyo (JP) --.

Signed and Sealed this

Nineteenth Day of August, 2003

JAMES E. ROGAN
*Director of the United States Patent and Trademark Office*